(12) United States Patent
Adachi et al.

(10) Patent No.: US 6,537,835 B2
(45) Date of Patent: Mar. 25, 2003

(54) METHOD OF MANUFACTURING SEMICONDUCTOR DEVICE AND APPARATUS OF AUTOMATICALLY ADJUSTING SEMICONDUCTOR PATTERN

(75) Inventors: Naoyasu Adachi, Kanagawa (JP); Katsuya Suzuki, Nagasaki (JP); Masayuki Noguchi, Nagasaki (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/037,988

(22) Filed: Oct. 23, 2001

(65) Prior Publication Data
US 2002/0106818 A1 Aug. 8, 2002

(30) Foreign Application Priority Data
Oct. 25, 2000 (JP) .......................... 2000-325173

(51) Int. Cl.[7] .................... H01L 21/66; H01L 21/00
(52) U.S. Cl. .................... 438/14; 438/5; 438/15; 438/16; 438/942; 438/947
(58) Field of Search ................... 438/5, 14, 15, 438/16, 347, 151, 152, 161, 162, 26, 585, 12, 13, 942, 945, 951

(56) References Cited

U.S. PATENT DOCUMENTS

| 4,309,225 A | * | 1/1982 | Fan et al. ...................... 438/72 |
| 4,840,874 A | * | 6/1989 | Gumiaki et al. ............. 430/311 |
| 5,498,877 A | * | 3/1996 | Shiraki ..................... 250/491.1 |
| 5,801,832 A | * | 9/1998 | Van Den Brink ........... 356/500 |
| 5,936,252 A | * | 8/1999 | Stickel et al. .......... 250/492.23 |
| 5,986,263 A | * | 11/1999 | Hiroi et al. .................. 250/310 |
| 6,373,054 B2 | * | 4/2002 | Hiroi et al. .................. 250/310 |
| 6,433,561 B1 | * | 8/2002 | Satya et al. .................. 324/753 |
| 2001/0002697 A1 | * | 6/2001 | Hiroi et al. .................. 250/310 |
| 2002/0042171 A1 | * | 4/2002 | Zhang et al. ................ 438/151 |

* cited by examiner

Primary Examiner—Michael S. Lebentritt
(74) Attorney, Agent, or Firm—Sonnenschein, Nath & Rosenthal

(57) ABSTRACT

A method of manufacturing a semiconductor device and an apparatus of automatically adjusting a semiconductor pattern can precisely correct a difference in the shape or position of a pattern exposed or formed in two exposure steps. A pattern measuring unit measures an offset between the first pattern and the second pattern in a pattern measuring step. Based on the information on the offset thus detected, the first pattern is adjusted in a first patterning step with a high degree of freedom in the next manufacturing step cycle of a semiconductor device to precisely align the shape or position of the first pattern with the second pattern in a second patterning step with a low degree of freedom.

5 Claims, 11 Drawing Sheets

METHOD OF MANUFACTURING SEMICONDUCTOR DEVICE AND APPARATUS OF AUTOMATICALLY ADJUSTING SEMICONDUCTOR PATTERN

RELATED APPLICATION DATA

The present application claims priority to Japanese Application(s) No(s). P2000-325173 filed Oct. 25, 2000, which application(s) is/are incorporated herein by reference to the extent permitted by law.

BACKGROUND OF THE INVENTION

1. Field of the Invention

The present invention relates to a method of manufacturing a semiconductor device including a step of exposing a fine pattern with precise alignment, and an apparatus of automatically adjusting a semiconductor exposure pattern for use in the method.

2. Description of Related Art

In semiconductor devices such as so-called integrated circuits, a finer pattern and a higher integration degree are recently required in association with a larger capacity of memory or a larger number of functions of logics in a CPU (Central Processing Unit). In addition to the integrated circuits, a finer pattern and a higher integration degree are similarly required, for example in imaging devices such as CCDs (Charge Coupled Device), as a type of the semiconductor devices by making good use of a fine pattern forming technique which has been developed in the integrated circuits.

In the semiconductor devices such as the integrated circuits, an exposure step was typically performed with a step & repeat method using a so-called stepper exposure unit before a generation in which a 0.25 $\mu$m design rule is applied. In a generation in which a 0.25 to 0.18 $\mu$m design rule is applied or in a later generation, however, a single manufacturing process for a semiconductor device has employed both an exposure step with the step & repeat method and an exposure step with a scan method using a so-called scanner exposure unit (also referred to as "a scan exposure unit").

The exposure step in the step & repeat method involves the use of a reticle having a mask pattern formed thereon at a predetermined scaling factor such as 5 times or 10 times in some cases for performing an exposure step to scale down the pattern onto a semiconductor wafer at a predetermined scaling factor. While this exposure step has an advantage of high throughput, it does not necessarily function well for the exposure process of a pattern with a line width design rule of less than 0.25 $\mu$m because of limits of resolution or difficulty in making fine adjustments of the pattern during the exposure process.

On the other hand, in the exposure step in the scan method, an exposure step of one mask pattern for one chip involves irradiating an elongated slit area with light and scanning the entire mask pattern through the slit area to perform an exposure step of the entire shot. Since this exposure step allows precise exposure of a very fine pattern with high resolution and permits many parameters for shape correction with a higher degree of freedom, fine adjustments of patterns can be made during the exposure step. In this exposure step, however, both stages of a reticle and a wafer must be controlled simultaneously and thus equipment therefore becomes complicated to cause a higher process cost than the step & repeat method.

To address this, it is becoming popular practice to employ such scan method to perform the exposure in a device pattern forming step which strongly requires precise formation of a fine pattern of less than 0.25 $\mu$m such as each structural part of a device or a wiring pattern on the one hand, and on the other hand, to employ the step & repeat method to perform an exposure step in a step of forming a so-called rough-layer pattern with a relatively low fineness of 0.25 $\mu$m or more, for example a resist pattern for use in an ion implantation step.

Typically, since the step of forming a pattern of a rough-layer or the like is performed after the device pattern forming step, the exposure step in the step & repeat method is performed after the exposure step by the scan method.

The exposure step in the step & repeat method, however, allows only scale-up/scale-down and parallel shifts over the entire exposure area with regard to adjustments of the shape or a position of a pattern, so that it has a lower degree of freedom than the exposure step in the scan method. Thus, if an offset occurs in the shape or the position of the pattern in the exposure step of the scan method performed earlier, a problem arises in that the existing offset cannot be corrected precisely in some cases in the exposure step of the step & repeat method performed later.

For example, if the exposure step in the scan method results in distortion in an aspect ratio over the entire exposure area, the exposure step with the step & repeat method performed thereafter cannot adjust the dimensions independently in the vertical and horizontal directions over the entire exposure area. For this reason, if adjustments are made to correct the offset only in one of the directions, the offset in the other direction may remain uncorrected or the amount of the offset may increase.

Alternatively, it is contemplated that an effective approach is to prevent occurrence of an offset in the shape or a position in a pattern in the exposure step in the scan method. To realize the approach, however, it is necessary to add a step of forming a marking for indicating a reference point of alignment in the exposure step by the scan method on a wafer to be patterned prior to the exposure step in the scan method since the exposure step in the scan method is typically performed earlier. The necessity causes an additional disadvantage of more complicated manufacturing steps or a lower throughput.

SUMMARY OF THE INVENTION

The present invention has been made in view of such problems, and it is an aspect of the present invention to provide a method of manufacturing a semiconductor device and an apparatus of automatically adjusting a semiconductor pattern which can precisely correct a difference in the shape or position of a pattern between an exposure step as a first patterning step and an exposure step performed after the above exposure step as a second patterning step, wherein the first patterning step has a predetermined degree of freedom for allowing exposure of a high-fineness pattern, for example with the scan method, and the second patterning step has a lower degree of freedom than the first patterning step, for example with the step & repeat method.

A method of manufacturing a semiconductor device according to the present invention comprises the steps of: a first patterning step including a step of exposing a first pattern on a semiconductor substrate in a shape adjusted with a predetermined degree of freedom; and a second patterning step including a step of exposing a second pattern, while the second pattern is aligned with the first pattern, in a shape adjusted with a degree of freedom equal to or lower than the degree of freedom in the first patterning step with an exposure method or an exposure unit different from that in the first exposure step, wherein a difference in the shape and/or position between the first pattern and the second pattern is measured, and information on the difference is relied on to adjust the shape of a first pattern in a first patterning step performed next the first patterning step in which the difference is measured or later.

An apparatus of automatically adjusting a semiconductor exposure pattern according to the present invention is used in a process of manufacturing a semiconductor device comprising the steps of: a first patterning step including a step of exposing a first pattern on a semiconductor substrate in a shape adjusted with a predetermined degree of freedom; and a second patterning step including a step of exposing a second pattern, while the second pattern is aligned with the first pattern, in a shape adjusted with a degree of freedom equal to or lower than the degree of freedom in the first patterning step with an exposure method or an exposure unit different from that in the first exposure step, the apparatus comprising: pattern measuring means for measuring a difference in the shape and/or position between the first pattern and the second pattern; and pattern adjusting means for relying on information on the difference to adjust the shape of a first pattern in a first patterning step performed next the first patterning step in which the difference is measured or later.

In the method of manufacturing a semiconductor device according to the present invention, a difference in the shape or position is measured between the first pattern obtained with the exposure method in the first patterning step having a high degree of freedom for the shape or position of an exposure pattern and the second pattern obtained with the exposure method in the subsequent second patterning step having a lower degree of freedom in a manufacturing process of a semiconductor device, and the information on the difference is relied on to adjust a first pattern in a first patterning step with a high degree of freedom in the next manufacturing step cycle of the semiconductor device, thereby precisely align the shape or position of the first pattern with the second pattern in the second patterning step with a lower degree of freedom.

In the apparatus of automatically adjusting a semiconductor exposure pattern according to the present invention, the pattern measuring means measures a difference in the shape or position between the first pattern and the second pattern in the aforementioned manufacturing method, and the pattern adjusting means adjusts the first pattern in the first patterning step. Thus, the method of manufacturing a semiconductor device as described above is embodied.

As described above, according to the method of manufacturing a semiconductor device in an embodiment of the present invention or the apparatus of automatically adjusting the semiconductor exposure pattern in an embodiment of the present invention, a difference in the shape or position is measured between the first pattern obtained with the exposure method in the first patterning step and the second pattern obtained with the exposure method in the second patterning step having a lower degree of freedom in a manufacturing step cycle of a semiconductor device, and the information on the difference is relied on to adjust the first pattern in a first patterning step with a high degree of freedom such that the shape or position of the first pattern matches the second pattern in a second patterning step with a lower degree of freedom in the next manufacturing step cycle or later of the semiconductor device. Thus, the shape or position of the first pattern in the first patterning step with a high degree of freedom can advantageously match (be aligned with) the second pattern precisely in the second patterning step with a low degree of freedom in the next manufacturing step cycle or later.

In addition, according to the method of manufacturing a semiconductor device in an embodiment of the present invention, a difference in the shape or position is measured between the first pattern and the second pattern in a lot in the prototyping stage and the measurement results are relied on to adjust the shape of the first pattern in the first patterning step for a production lot. Thus, even if an offset in the shape or position enough to be recognized as a defective item occurs in a lot at the prototyping stage, the first pattern can be precisely aligned with the second pattern in a production lot based on the information on the difference, thereby making it possible to advantageously prevent the occurrence of a defective item to improve manufacturing yields. Furthermore, since the first pattern can be aligned with the second pattern without forming a reference pattern for alignment or the like prior to the first patterning step in a manufacturing process of each wafer or semiconductor device in a production lot, it is possible to avoid a complicated manufacturing method due to an additional step of forming such a reference pattern.

DESCRIPTION OF THE PREFERRED EMBODIMENTS

A preferred embodiment of the present invention will hereinafter be described in detail with reference to the drawings.

Figure 1:
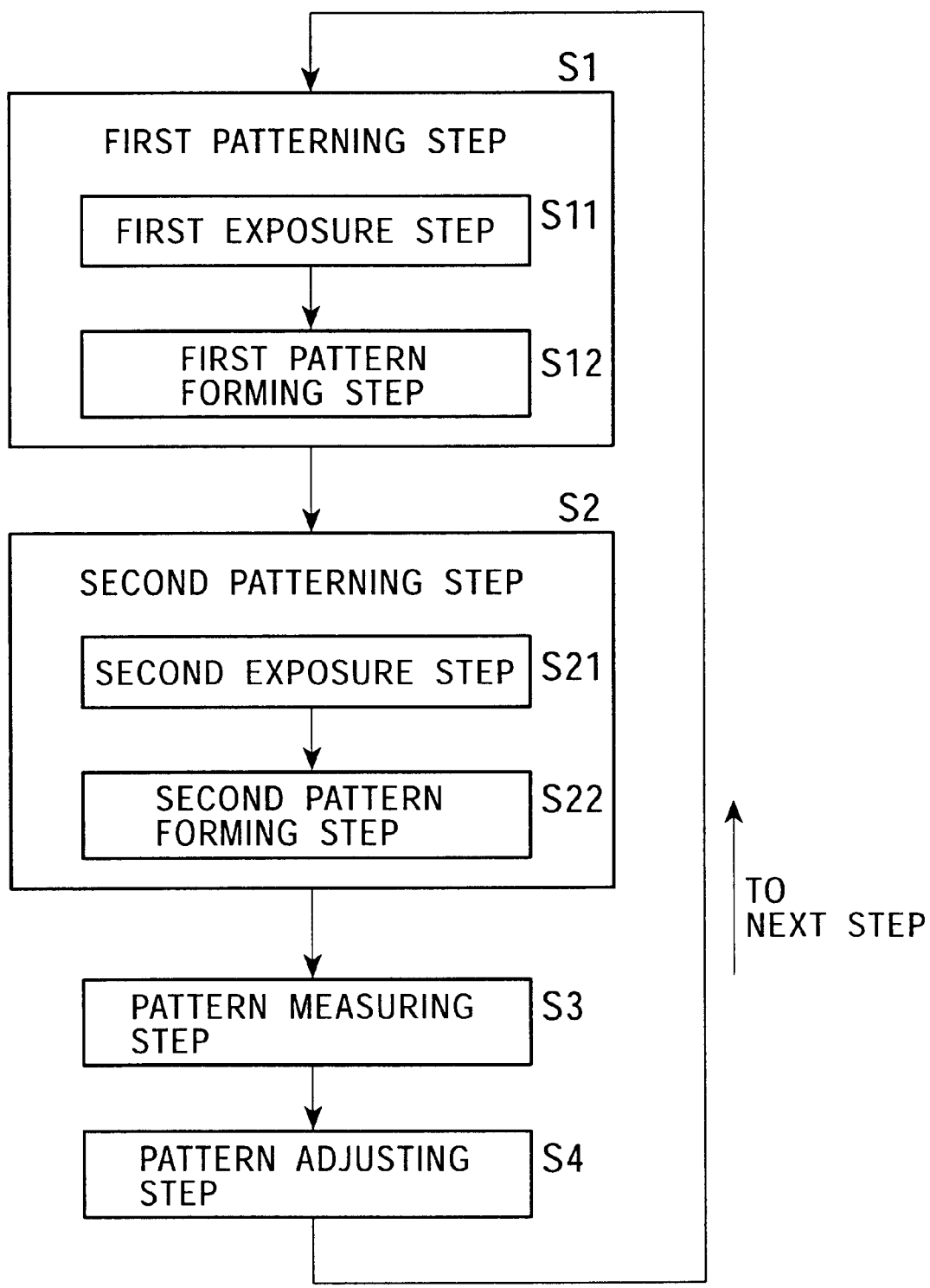
FIG. 1 illustrates a general flowchart of a method of manufacturing a semiconductor device according to an embodiment of the present invention.

FIG. 1 illustrates a general flowchart of a method of manufacturing a semiconductor device according to an embodiment of the present invention, and FIGS. 2A to 2D schematically illustrate each step thereof. It should be noted that since a first patterning step, a second patterning step, a pattern measuring step, and a pattern adjusting step are the most important steps in the embodiment and other steps such as a resist applying step or an ion implantation step are conventional ones, the pattern measuring step and the pattern adjusting step as mentioned above are explained in detail especially in the following description to avoid complicated illustration and explanation.

The method of manufacturing a semiconductor device comprises a first patterning step (S1), a second patterning step (S2), a pattern measuring step (S3), and a pattern adjusting step (S4), as its main steps.

Figure 2A:
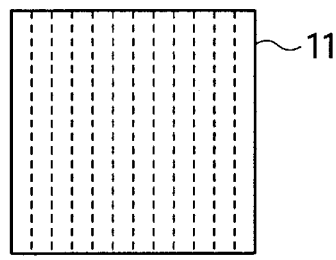
FIGS. 2A to 2D each schematically illustrate patterns formed in each step in the method of manufacturing a semiconductor device shown in FIG. 1.
Figure 2B:
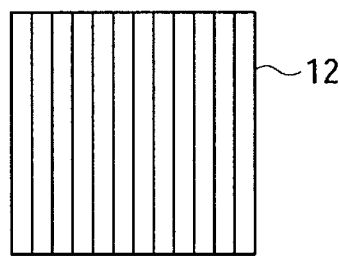
Figure 2C:
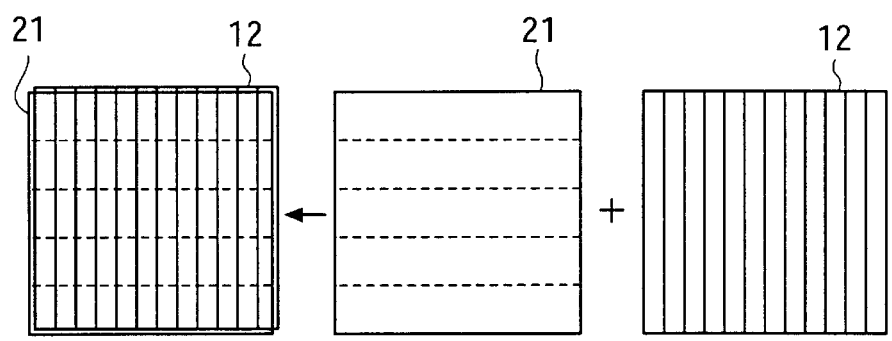
Figure 2D:
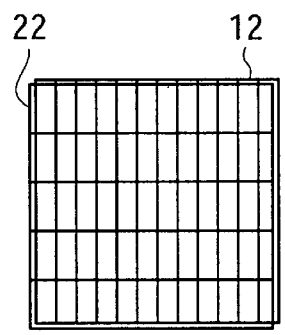

More particularly, the first patterning step (S1) includes a first exposure step (S11) and a fist pattern forming step (S12) for forming a high-fineness first pattern 12 including structures or wiring of each chip of a semiconductor device on one wafer as shown in FIG. 2B. The pattern formed in the first patterning step is referred to as "the first pattern 12". A pattern formed in the second patterning step (S2), later described, is referred to as "a second pattern 22". In FIGS. 2A to 2D, the first pattern 12 is shown with vertical stripes, and the second pattern 22 is shown with horizontal stripes.

In the first exposure step (S11), a resist is exposed by the scan method using a scanner exposure unit which can perform exposure of a high-resolution and high-fineness pattern with a higher degree of freedom for adjusting the shape or a position of the exposed pattern than a stepper exposure unit or the like, and a latent image transferred through the exposure is developed, thereby forming a first resist pattern 11. In the first pattern forming step (S12), an etching step or the like is performed on the wafer to form the first pattern 12 for each chip based on the first resist pattern 11.

The second patterning step (S2) includes a second exposure step (S21) and a second pattern forming step (S22) for performing patterning of a so-called rough-layer or the like on the aforementioned wafer subsequent to the first patterning step (S1), and this second patterning step (S2) does not require as high a resolution as the first patterning step (S1), for example a pattern of a resist or a sacrificial layer for temporarily covering a part requiring no ion implantation to block implanted ions or a wiring with a relatively large line width.

In the second exposure step (S21), the exposure of the resist is performed with high throughput in the step & repeat method using the stepper exposure unit which has a lower resolution or a lower degree of freedom for adjusting the shape or position of the exposed pattern than the scan method using the scanner exposure unit or the like but provides high throughput and the economies of mass production. In the second pattern forming step (S22), for example, when a resist for blocking used in the ion implantation step is to be formed, the latent image obtained from the second exposure step (S21) is developed to form a desired second resist pattern 21 which substantially serves as the second pattern 22. Alternatively, for example, when the patterning of the so-called rough-layer is performed such as a wiring pattern with a relatively large line width, the latent image is developed in the second exposure step (S21) to form the second resist pattern 21 which is then used to perform a successive process such as an etching process on the wafer. Thus, the second pattern 22 of the rough-layer can be formed.

The pattern measuring step (S3) measures a difference in the shape or a position (offset) between the first pattern 12 and the second pattern 22 after the first patterning step (S1) and the subsequent second patterning step (S2) are performed.

Parameters for the amount of the offset include many types as later described, and it is preferable to measure all types of parameters in accordance with the degree of freedom of the exposure unit used in the first patterning step (S1) (in other words, all parameters adjustable with the exposure unit). This is because, when the first patterning step (S1) and the second patterning step (S2) are considered as a series of controlled systems and the pattern measuring step (S3) and the pattern adjusting step (S4) are considered as a feedback control system, a higher number of types of parameters for providing the quantity of state for the feedback allows more precise alignment of the pattern shape or the position in the pattern adjusting step (S4) from the viewpoint of a measurement engineering and a control engineering.

The pattern adjusting step (S4) calculates correction data for adjusting the shape or the position of the first pattern 12 in the first patterning step (S1) based on the information on the amount of the offset between the first pattern 12 and the second pattern 22 measured in the pattern measuring step (S3), and adjusts the shape or the position of the first pattern 12 in the next production lot in accordance with the correction data, thereby making correction for precise alignment of the first pattern 12 and the second pattern 22.

In the pattern adjusting step (S4), the amount of the offset is measured between the first pattern 12 and the second pattern 22 or the second resist pattern 21. Specifically, on the first pattern 12 formed in the exposure step with a high degree of freedom such as in the scan method using the scanner exposure unit in the first patterning step (S1) as described above, the second resist pattern 21 as the second pattern 22 or the second pattern 22 of the semiconductor device itself is formed in the exposure step such as in the step & repeat method using the stepper exposure unit with a lower degree of freedom than the scan method, and then the amount of the offset between the first pattern 12 and the second pattern 22 is measured in the pattern adjusting step (S4). Based on the information on the offset amount, in the next production lot, the first pattern 12 is corrected by the scanner exposure unit capable of adjusting the pattern with a higher degree of freedom. With these steps, the first pattern 12 can be aligned precisely with the second pattern 22 by exploiting the characteristic of the scanner exposure unit in the first exposure step (S11) which can adjust the shape or the position of the pattern with a high degree of freedom. In addition, since it is not necessary to add a step of forming a reference marking or the like for alignment for each wafer prior to the first patterning step (S1), complicated manufacturing steps can be avoided simultaneously with the realization of more precise alignment, and furthermore, improved throughput and lower manufacturing cost can be achieved effectively.

In general, prior to the start of a production lot for a lot of wafers, so-called preliminary prototyping or conditioning for the production is performed, for example, using a sample wafer for a test as a preliminary prototyping lot. In such preliminary prototyping step, the amount of the offset between the first pattern 12 and the second pattern 22 is measured, and the information on the offset amount is used in an actual manufacturing of a production lot to align the first pattern 12 with the second pattern 22 for the shape or the position. Thus, the occurrence of defective items resulting from a misaligned pattern can be eliminated in the manufacturing process of the production lot to achieve improvements in substantial manufacturing yields.

While the pattern of the semiconductor device itself formed on the wafer surface in the first patterning step (S1) is measured as the first pattern 12 in the aforementioned description, it is possible, by way of example, that the first resist pattern 11 formed in the first exposure step (S11) is compared with the second pattern 22 of the semiconductor device itself formed in the second patterning step (S2), the amount of the offset between them is measured, and the shape or the position of the first pattern 12 is adjusted in the first exposure step (S11) such that the offset can be eliminated in consideration of an etching factor or the like.

Figure 3:
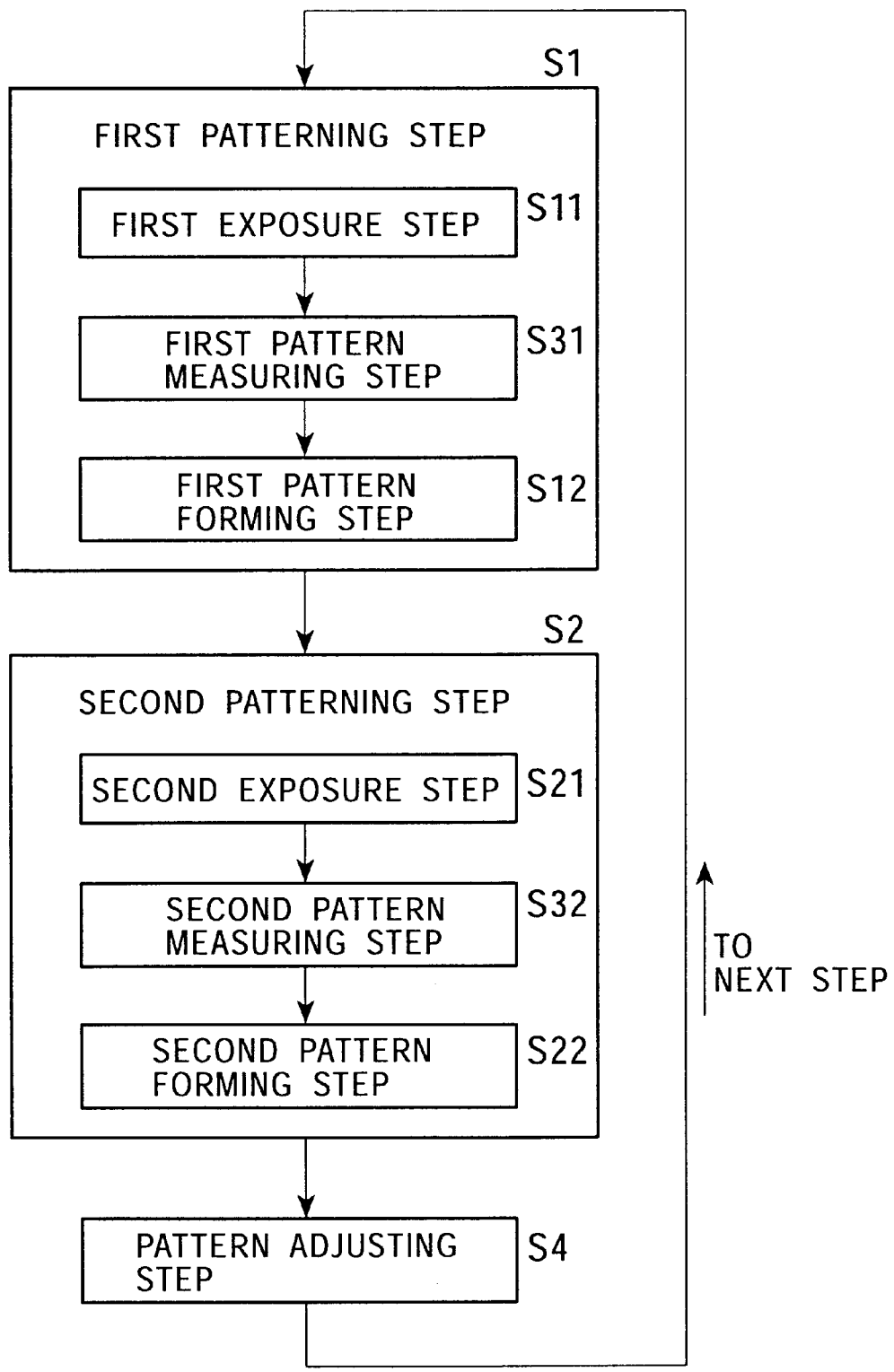
FIG. 3 illustrates an exemplary flowchart of a manufacturing step cycle when an offset between a first resist pattern and a second resist pattern is measured.

Alternatively, as shown in an example of FIG. 3, it is possible that the first resist pattern 11 formed in a first patterning step (S1) is measured in a first pattern measuring step (S31) instead of the first pattern 12, the second resist pattern 21 formed in a second patterning step (S2) is measured in a second pattern measuring step (S32) instead of the second pattern 22, the resist patterns are compared to know the amount of the offset between them, and then, the shape or the position of the first resist pattern 11 to be exposed is adjusted in a first exposure step (S11) such that the first pattern 12 can match with the second pattern 22 by correcting the offset.

Next, description will be made in detail for the effects in the manufacturing method of the embodiment centering on the pattern measuring step (S3) and the pattern adjusting step (S4). Since such effects are embodied with the operation of a semiconductor exposure pattern automatic adjustment apparatus according to the embodiment, the apparatus and the steps will hereinafter be described in combination.

Figure 4:
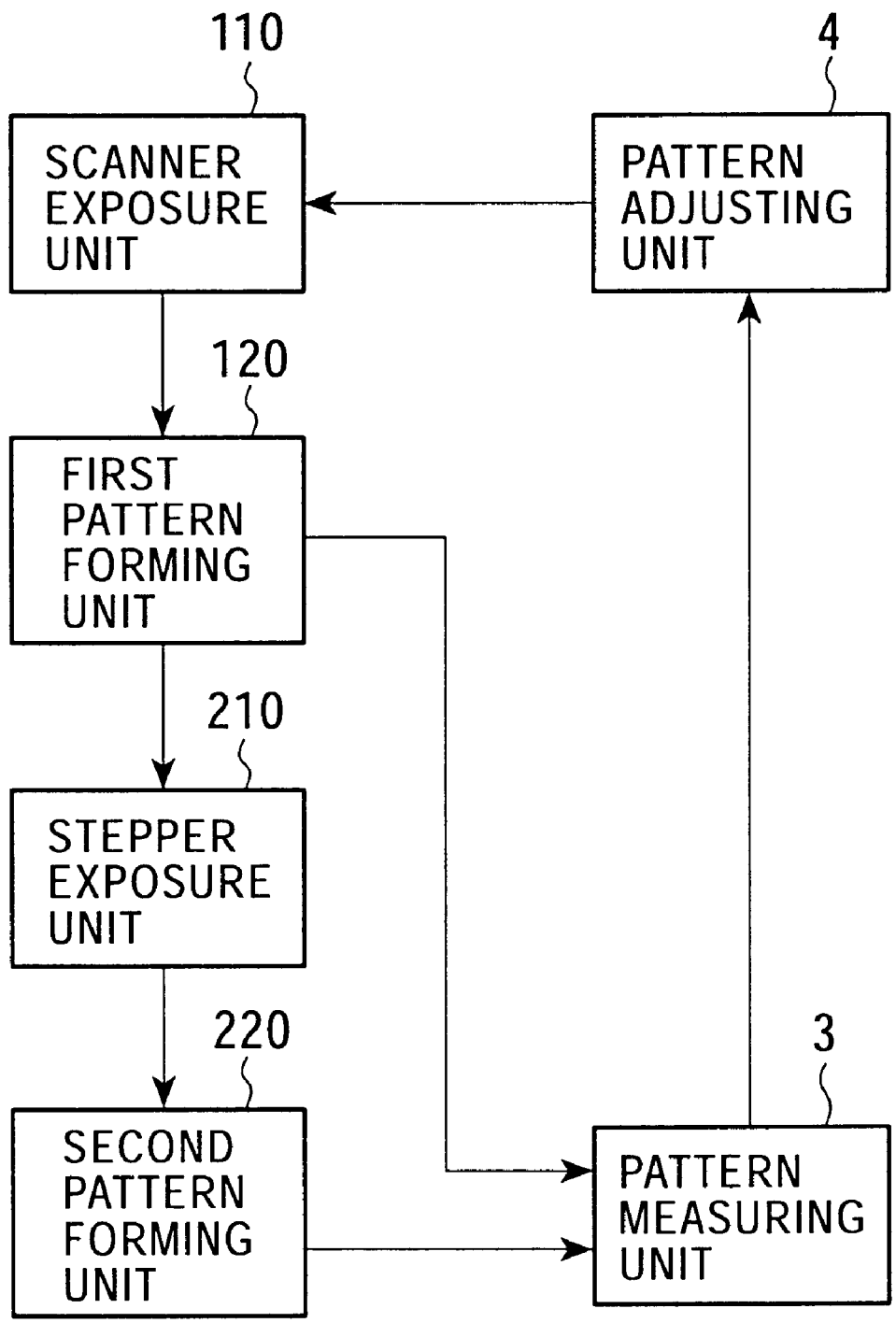
FIG. 4 is a block diagram illustrating a general configuration of main portions for conducting a first patterning step and a second patterning step in a semiconductor manufacturing system including a semiconductor exposure pattern automatic adjustment apparatus.

FIG. 4 schematically shows a block diagram of a general configuration of main portions for conducting the first patterning step and the second patterning step in a semiconductor manufacturing system including the semiconductor exposure pattern automatic adjustment apparatus. The semiconductor manufacturing system comprises, as its main portions, a scanner exposure unit 110 for conducting the first exposure step (S11), a first pattern forming unit 120 for developing a latent image formed through the exposure to conduct the first pattern forming step (S12), a stepper exposure unit 210 for conducting the second exposure step (S21), a second pattern forming unit 220 for developing a latent image formed through the exposure to conduct the second pattern forming step (S22), a pattern measuring unit 3 for conducting the pattern measuring step (S3), and a pattern adjustment unit 4 for conducting the pattern adjustment step (S4) of adjusting the shape or the position of the pattern to be exposed in the scanner exposure unit 110 based on the measurement results.

Figure 5:
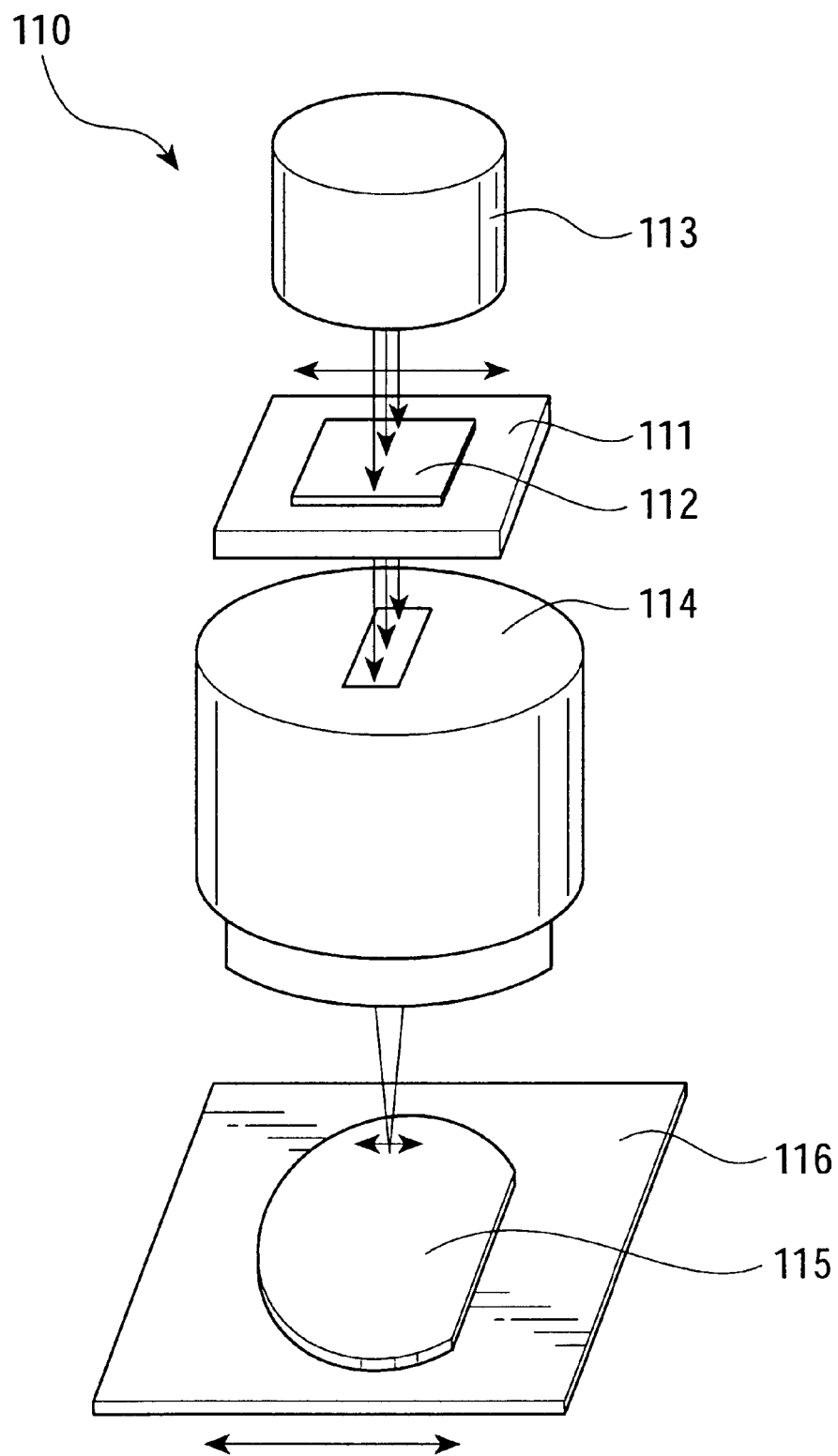
FIG. 5 illustrates an example of a schematic structure of a scanner exposure unit.

The scanner exposure unit 110, an example of which is shown in FIG. 5, has a reticle 112 mounted on a reticle scan stage 111 set to allow parallel shifts and scans the entire reticle 112 through an elongated slit area irradiated with light from a light source system 113 through a lens system 114 to expose the entire chip. After the exposure of one chip is completed, a wafer scan stage 116 having a wafer 115 mounted thereon is moved to expose the next one chip. These operations are repeated to transfer a high-fineness chip pattern of, for example, less than 0.25 $\mu$m, onto the entire effective area of each wafer 115. When the scanning is performed with the light during the exposure process, the outside shape or the position of the chip pattern can be adjusted with a high degree of freedom. For such scanner exposure unit 110 itself (hardware and its basic exposure functions), a common unit can be used, for example a scanner exposure unit Model S203 manufactured by Nikon Corporation. For the exposure conditions, for example an exposure of 25 mJ and a focus offset of 0.0 $\mu$m can be set, although it goes without saying that the optimal settings of the exposure conditions vary depending on various conditions in the process.

When the scanner exposure unit 110 is used to perform the preliminary prototyping prior to the start of manufacturing of a production lot, the information on the offset between the first pattern and the second pattern is not obtained yet for the production lot at that point. Thus, in this case, the first exposure step is performed with maximum accuracy by the scanner exposure unit 110 alone.

The first pattern forming unit 120 forms the first pattern 12 on the wafer 115 through a dry etching or wet etching process based on the first resist pattern 11 after the development of the latent image of the first resist pattern 11 formed by the scanner exposure unit 110.

The pattern measuring unit 3 measures predetermined points in the outer shape of the first pattern 12 thus formed. For example, the pattern measuring unit 3 measures the positions of four vertices on the periphery of the first pattern 12 for each of substantially rectangular chips. As the hardware of the pattern measuring unit 3 for measuring such predetermined points of the first pattern 12, a registration measurement system manufactured by Hitachi Deco Ltd. can be used, for example.

Alternatively, the predetermined points in the outer shape of the first pattern 12 may be measured simultaneously with the measurement of predetermined points in the outer shape of the second pattern 22 after the formation of the second pattern 22. In this case, however, it must be possible to clearly detect the first pattern 12 and the second pattern 22 independently.

Alternatively, it is possible that the predetermined points in the outer shape of the first resist pattern 11 formed in the first exposure step (S11) are measured, then the first pattern forming step (S12) or the like is passed, the predetermined points in the outer shape of the second resist pattern 21 formed in the second exposure step (S21) are measured, and the outer shapes of the resist patterns are compared. In this case, it is necessary that the hardware (the registration measurement system) of the pattern measuring unit 3 has an optimally set pattern detecting function such that it can optically detect the first resist pattern 11 and the second resist pattern 21 with accuracy.

While a diffusion step or a cleaning step is typically performed in reality after the formation of the first pattern 12, detailed description of such steps is omitted to simplify the explanation.

Figure 6:
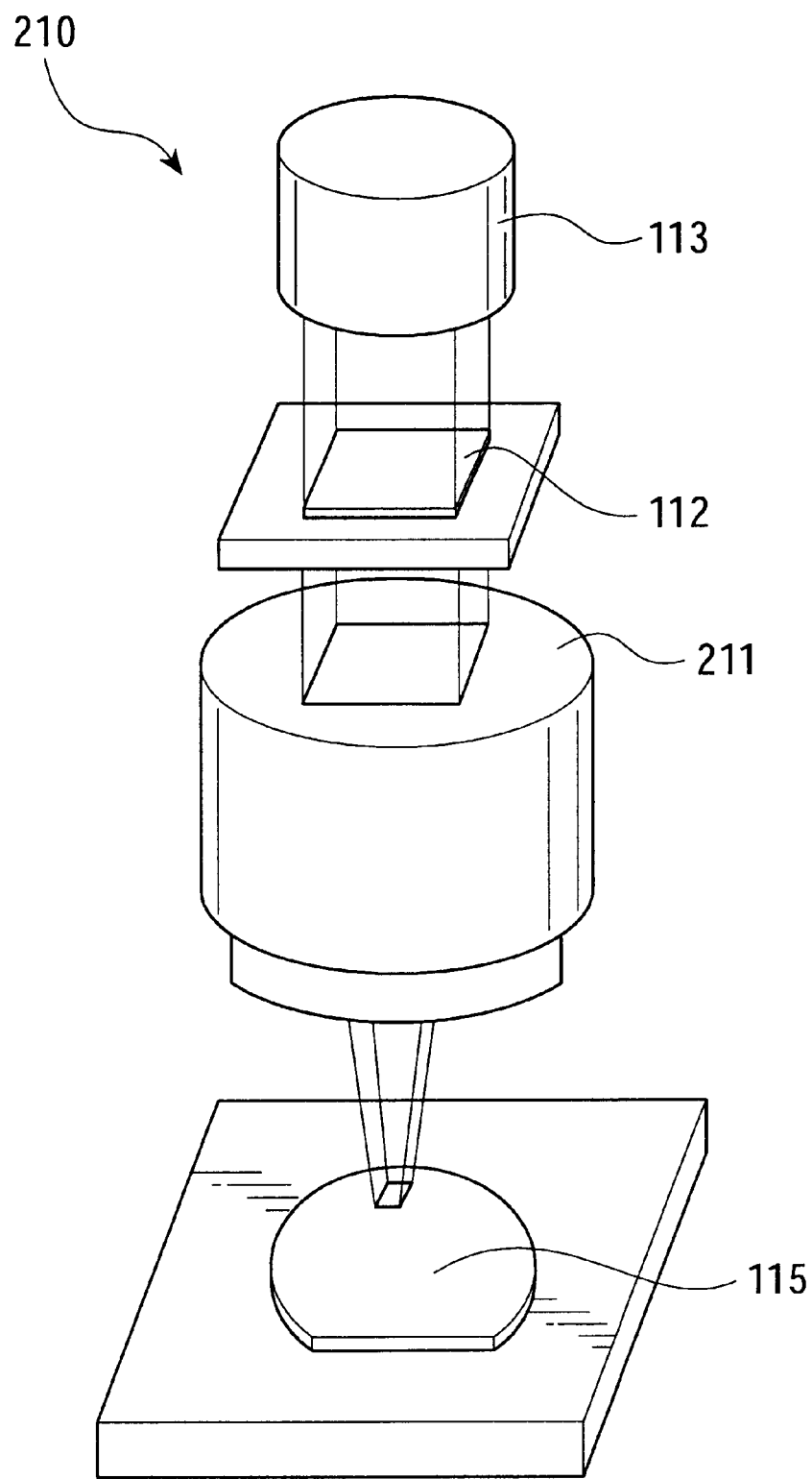
FIG. 6 illustrates an example of a schematic structure of a stepper exposure unit.

The stepper exposure unit 210, an example of which is shown in FIG. 6, uses a reticle 112 having a mask pattern formed thereon of a size, for example 5 times larger than the actual pattern to perform the exposure of one shot through a reduction projection lens system 211. After the exposure of one shot, exposure of the next shot is performed, and these operations are repeated, thereby transferring a relatively low fineness pattern of, for example, a line width of 0.25 $\mu$m or more onto the entire effective area of the one wafer 115 with high throughput. As such stepper exposure unit 210 itself, a conventional one can be used, for example a stepper exposure unit model i14E manufactured by Nikon Corporation. For the exposure conditions at this time, an exposure of 300 ms and a focus offset of 0.0 $\mu$m can be set, for example. In addition, at this point, the stepper exposure unit 210 per-forms exposure while the second resist pattern 21 is aligned for each shot with the already formed first pattern 12 by, for example, using an EGA (Enhanced Global Alignment) mark as an alignment mark. It goes without saying, however, that although the use of the EGA mark allows the alignment of each shot with certain degree of accuracy, a degree of freedom and accuracy adjustable at this point are not greatly different from those of a conventional stepper.

The second pattern forming unit 220 develops the latent image transferred by the stepper exposure unit 210 to form a resist pattern for ion blocking used in an ion implantation step as the second pattern 22. Alternatively, the second pattern forming unit 220 forms the second pattern 22 on the wafer 115 through the dry etching or wet etching process based on the second resist pattern 21 obtained by developing the latent image transferred by the stepper exposure unit 210.

The pattern measuring unit 3 measures the predetermined points in the outer shape of the second pattern 22 thus formed. For example, the pattern measuring unit 3 measures the positions of the four vertices on the periphery of the second pattern 22 formed on the wafer 115 for each of substantially rectangular chips. Alternatively, as described earlier, the pattern measuring unit 3 may measure the predetermined points in the outer shape of the second resist pattern 21 formed in the second exposure step (S21) and compare the measured points with the predetermined points in the outer shape of the first resist pattern 11 measured in the first exposure step (S11). It goes without saying that the four vertices on the periphery of the second pattern 22 to be measured in this case correspond to the four vertices on the periphery of the first pattern 12, respectively, in design. For the number of points to be measured at this time, since generally a chip has a rectangular or a square in its outer shape in many cases, at least four or more points are preferably measured per chip, for example, a total of four points each for a corner or a total of four representative points each on a side. More preferably, the number of measured points is equal to or larger than the value of the possible degree of freedom for adjusting the exposed pattern in the first exposure step (S11). As an apparatus for measuring the predetermined points on the periphery of the second pattern 22, a registration measurement system manufactured by Hitachi Deco Ltd. can be used, for example, as in the first pattern 12.

FIGS. 7A to 7D and 8A to 8D show examples of parameters for an amount of the offset between the predetermined points on the first pattern 12 and the predetermined points on the second pattern 22 measured by the pattern measuring unit. Specifically, eight parameters are used: a positional offset in x, y directions (offset-x, y) shown in FIG. 7A; an accumulative spacing offset in x, y directions (scaling-x, y) shown in FIG. 7B; a wafer rotation shown in FIG. 7C; a shot arrangement distortion (wafer orthogonality) shown in FIG. 7D; a shot-scaling shown in FIG. 8A; a shot aspect ratio (shot-scaling-x, y) shown in FIG. 8B; a shot rotation shown in FIG. 8C; and a shot outer shape transformation (shot-orthogonality) shown in FIG. 8D. The pattern measuring unit 3 can make a measurement for each of the eight parameters, and based on the measurement results, the pattern adjusting unit 4 can correct the shape or the position of the first pattern 12 or the first resist pattern 11.

Figure 7A:
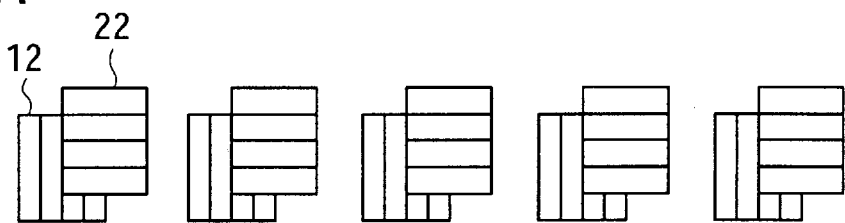
FIGS. 7A to 7D schematically illustrate several kinds of parameters for an amount of an offset between a first pattern and a second pattern.
Figure 7B:
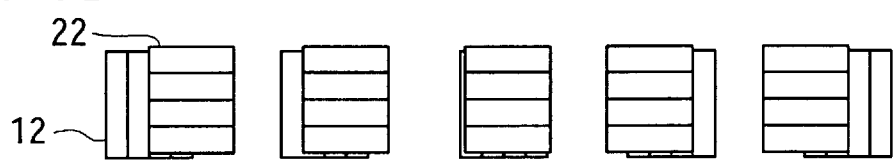

The positional offset in the x, y directions in FIG. 7A refers to a displacement caused by the second pattern 22 shifting in parallel with respect to the first pattern 12 in the x or y direction. The accumulative spacing offset in the x and y directions in FIG. 7B refers to a larger displacement of the chips of the second pattern 22 from the arranged chips of the first pattern 12 as a distance from the center of the arrangement is greater, and often occurs since the spacing between adjacent chips is larger than a predetermined dimension.

Figure 7C:
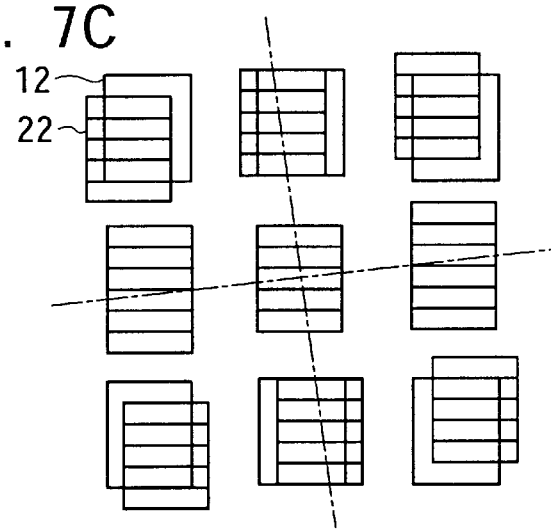
Figure 7D:
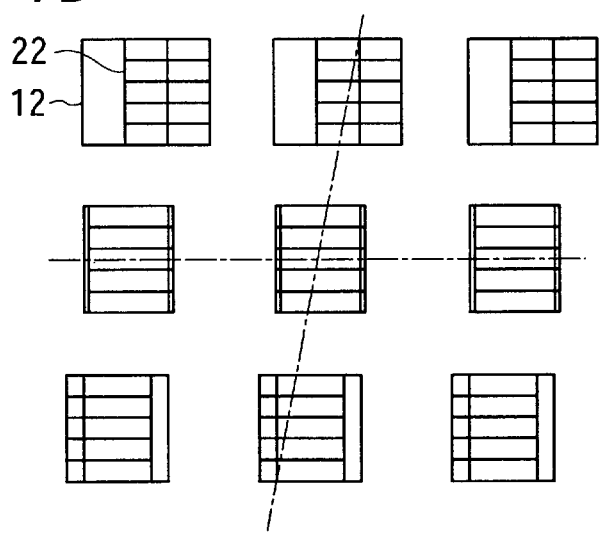

The wafer rotation in FIG. 7C refers to the displacement of the arranged chips of the first pattern 12 from the arranged chips of the second pattern 22 within one wafer in a rotational direction. The shot arrangement distortion in FIG. 7D refers to a displacement which is not seen on rectangular coordinates in the x or y direction resulting from an oblique arrangement or the like of the chips within one wafer. The shot scaling in FIG. 8A refers to a difference as similar figures in the outer dimension of one chip between the first pattern 12 and the second pattern 22. The shot aspect ratio in FIG. 8B results from a difference in the aspect ratio of the outer shape of one chip between the first pattern 12 and the second pattern 22. The shot rotation in FIG. 8C refers to a difference in orientation from one whole chip to another in a rotational direction. The shot outer shape transformation in FIG. 8D refers to a transformation of the outer shape of one chip into a parallelogram or a rhombus rather than a rectangular or a square.

Figure 8A:
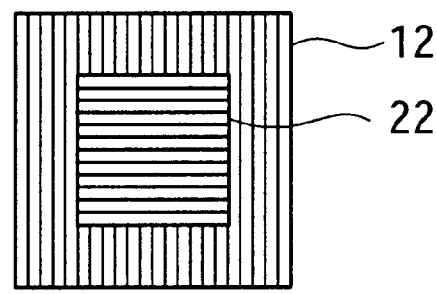
FIGS. 8A and 8D schematically illustrate other kinds of parameters than those shown in FIGS. 7A to 7D for an amount of an offset between the first pattern and the second pattern.
Figure 8B:
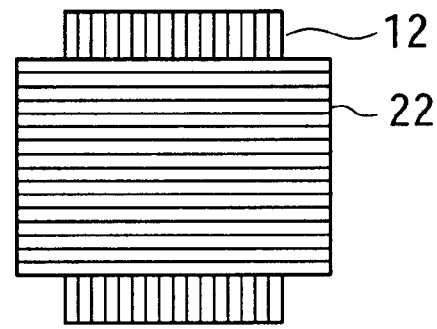
Figure 8C:
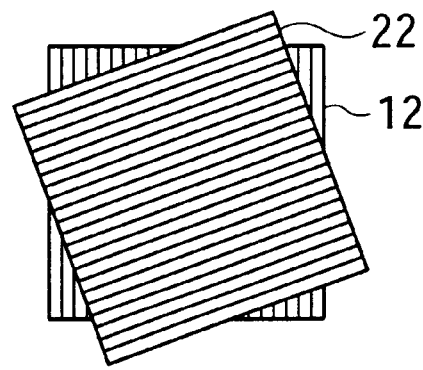
Figure 8D:
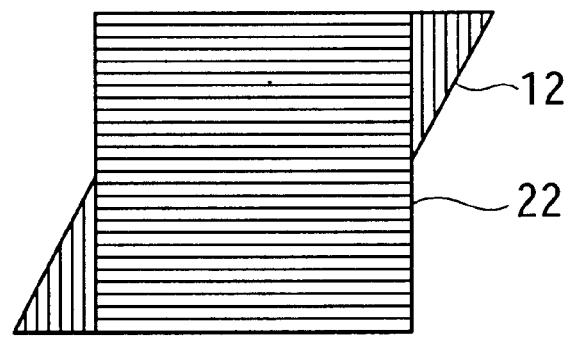

Of the parameters relating to the differences in the shape or position, especially the shot aspect ratio in FIG. 8B and the shot outer shape transformation in FIG. 8D cannot be corrected theoretically in the second exposure step (S21) since the stepper exposure unit 210 has an insufficient degree of freedom for adjusting the pattern.

Figure 11A:
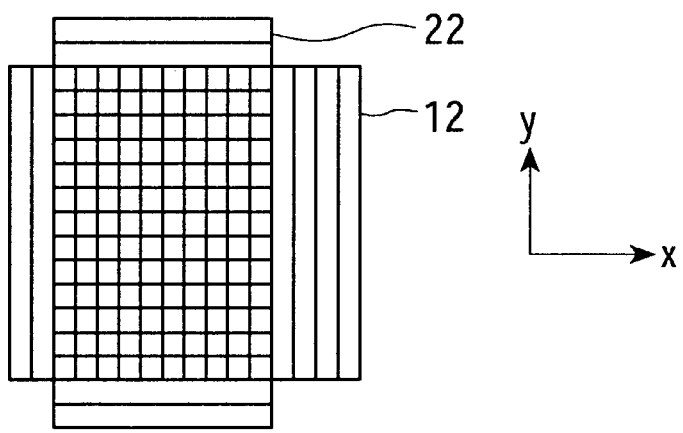
FIGS. 11A to 11C illustrate an example of aligning a second resist pattern exposed in a stepper exposure unit with a first pattern through a conventionally typical method as a comparative example.
Figure 11B:
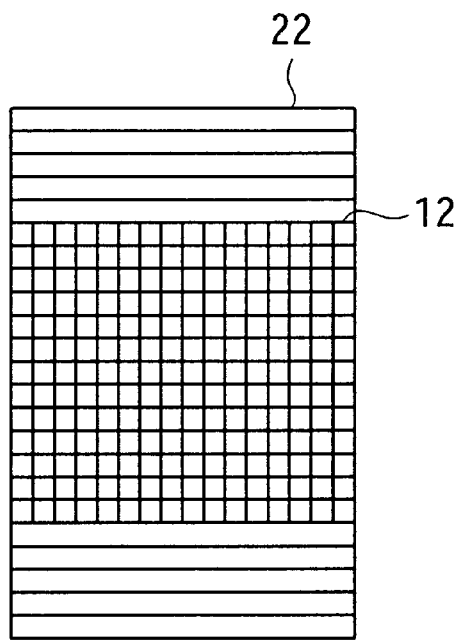
Figure 11C:
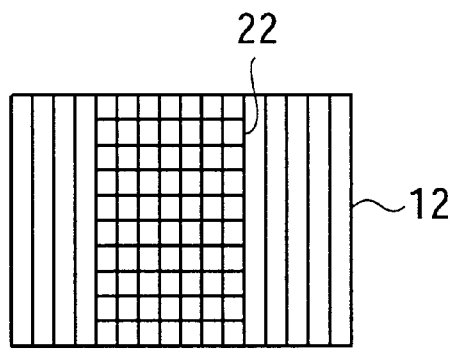

As a comparative example, consideration is given to a displacement produced from a difference in the shot aspect ratio between the first pattern 12 and the second pattern 22 as shown in FIG. 11A, by way of example. As shown in FIG. 11B, when a conventional adjustment method is used to adjust a transfer scaling factor to be larger in the exposure with the stepper exposure unit 210 such that the sides of the second pattern in the x direction (the horizontal direction in FIG. 11B) are sized to match the outer dimension of the first pattern 12 in the x direction, a larger difference occurs in the outer dimension (lengths of the sides) in the y direction (the vertical direction in FIG. 11B) although the sides of them match in the x direction. On the contrary, when the transfer scaling factor is adjusted to be smaller in the exposure with the stepper exposure unit 210 such that the sides of the second pattern 22 in the y direction are sized to match the outer dimension of the first pattern 12 in the y direction, a larger difference occurs in the outer dimension in the x direction although the sides of them match in the y direction.

When the shot outer shape transformation occurs in the first pattern 12 or the second pattern 22, it is impossible to precisely align the second pattern 22 with the first pattern 12 already formed at that time in the exposure step with the stepper exposure unit 210. This is because while the stepper exposure unit 210 can basically adjust the shape or the position of the exposed pattern only for deformation as similar figures and a degree of freedom in parallel shifts, it does not provide a degree of freedom for changing the outer shape of one shot from a rectangular to a parallelogram or a degree of freedom for freely changing the aspect ratio.

According to the manufacturing method of the embodiment, however, the offset between the first pattern 12 and the second pattern 22 is measured, and based on the information on the offset amount, the pattern adjusting unit 4, later described, corrects the shape or position of the first pattern 12 or the first resist pattern 11 with the exposure unit and the exposure step having a high degree of freedom such as the scanner exposure unit 110 in the next manufacturing step cycle. Thus, the offset between the first pattern 12 and the second pattern 22 can be corrected in the manufacturing step cycle performed after the production lot or the manufacturing step cycle in which the offset amount is measured, and precise alignment of them can be realized.

The pattern adjusting unit 4 relies on the aforementioned information on the offset amount between the first pattern 12 and the second pattern 22 measured by the pattern measuring unit 3 to correct the shape or position of the first pattern 12 with the exposure unit and the exposure step having a high degree of freedom such as the scanner exposure unit 110 in the manufacturing step cycle next to the step in which the measurement results are obtained.

FIG. 9 schematically shows an example of the operation for correcting the offset between the first pattern 12 and the second pattern 22 with the pattern adjusting unit 4. In FIG. 9, the difference in the shape or the position between the pattern 12 and the second pattern 22 is exaggeratedly represented for providing clearly understandable description.

Figure 9A:
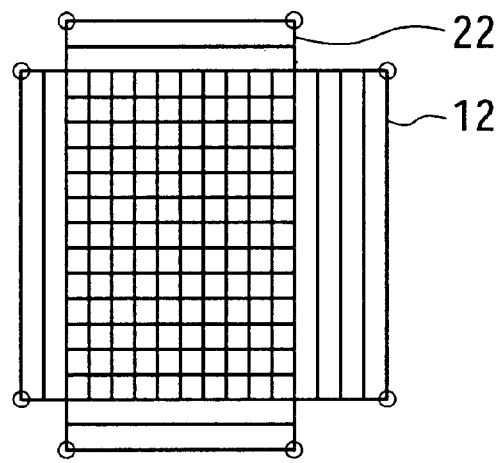
FIGS. 9A to 9C schematically illustrate an exemplary operation for correcting an offset between the first pattern and the second pattern with a pattern adjustment unit.
Figure 9B:
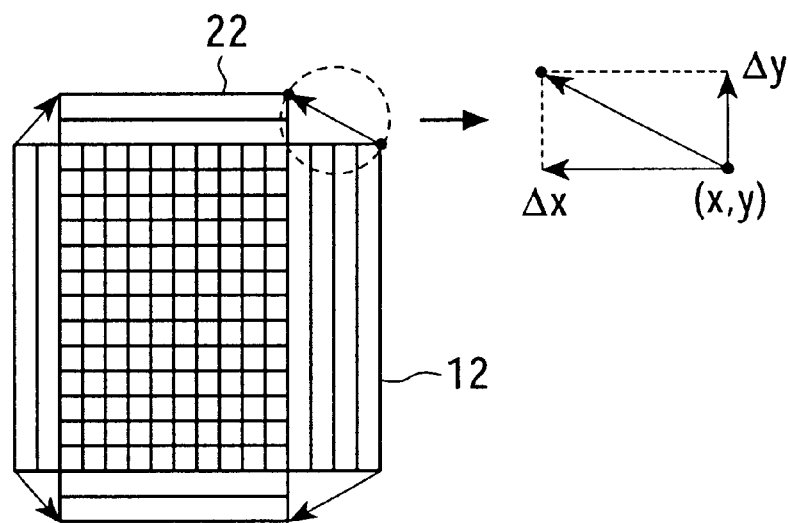
Figure 9C:
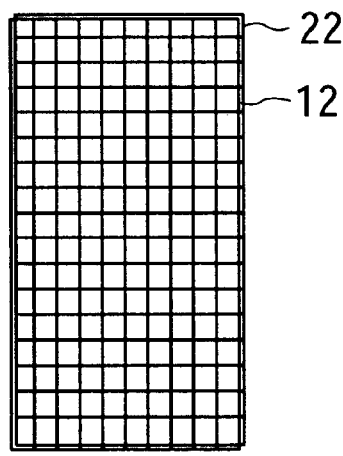

For example, when measurements in a preliminary prototyping step or the like result in the detection of an offset produced between a first pattern 12 and a second pattern 22 caused by variations in the shot aspect ratio as shown in FIG. 9A, in the first place, the pattern measuring unit 3 individually measures coordinates (x, y) of the vertices at four corners in the rectangular outer shape of one chip indicated by circles in FIG. 9A for each of the first pattern 12 and the second pattern 22. The individual coordinates of the corresponding vertices are compared between the first pattern 12 and the second pattern 22 to obtain an offset $\Delta x$ in the x direction and an offset $\Delta y$ in the y direction individually as shown in FIG. 9B. The exposure of the first resist pattern 11 in the first exposure step (S11) is adjusted such that the individual offset amounts are eliminated to remove the offset between the first pattern 12 and the second pattern 22 caused by the variations in the shot aspect ratio. It is thus possible to achieve precise alignment of both patterns as shown in FIG. 9C.

Figure 10A:
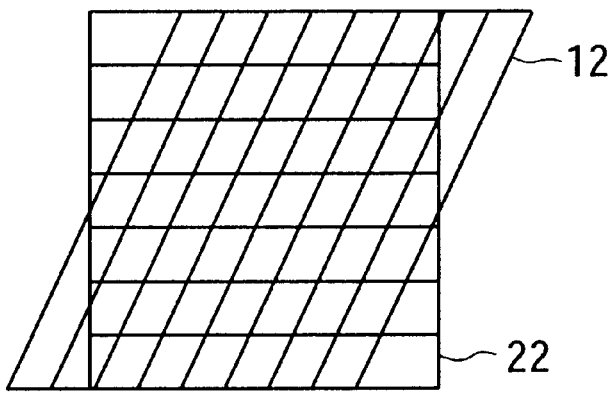
FIGS. 10A to 10C schematically illustrate another exemplary operation for correcting an offset between the first pattern and the second pattern with a pattern adjustment unit.
Figure 10B:
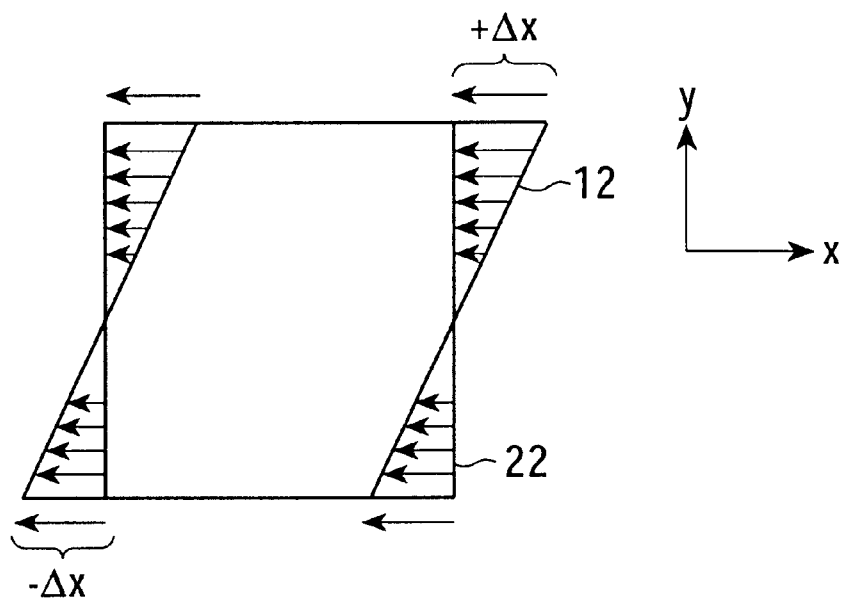
Figure 10C:
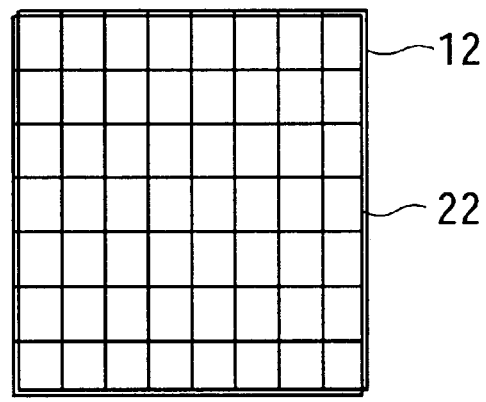

Alternatively, when a shot outer shape transformation occurs in the first pattern 12 as shown in FIG. 10A, two opposite sides of one chip have displacements in opposite directions. Specifically, a displacement in +x direction is produced on the top side of a chip, while a displacement in -x direction is produced in the bottom side of the chip. Thus, based on such measurement results, the occurrence of the shot outer shape transformation is determined in this case, and the outer shape of the entire chip of the first pattern can be corrected to a regular rectangular as shown in FIG. 10B to achieve precise alignment of both patterns as shown in FIG. 10C. It is preferable to perform such correction of the offset amount for all the parameters which can be used in correction in the first exposure step (S11) with the scanner exposure unit 110 to realize more precise alignment.

As described above, the pattern adjusting unit 4 adjusts the exposure of the first resist pattern 11 in the first exposure step (S11) based on the amount of the offset in the various parameters for the shape or position between the first pattern 12 and the second pattern 22 recognized by the pattern measuring unit 3 to allow the elimination of the offset between the first pattern 12 and the second pattern 22 without particularly adding a step of forming a reference mark for alignment prior to the first exposure step (S11) for each wafer or each shot. The parameters correctable with the pattern adjusting unit 4 include the shot rotation and others in addition to the aforementioned ones, and those parameters can be corrected individually. Since the offset between the first pattern and the second pattern is often produced due to a combination of a plurality of parameters, those parameters are individually measured and the information on the measurement results is subjected to, for example matrix processing. Thus, even when any offset is produced due to a combination of a plurality of factors, the offset can be corrected from the next production lot to perform precise alignment.

While the above description has been made for the use of the scanner exposure unit for performing exposure in the scan method in the first exposure step (the step for exposing the first pattern) and the use of the stepper exposure unit for performing exposure in the step & repeat method in the second exposure step (the step for exposing the second pattern), the combination of the exposure units and the exposure methods used in the first exposure step and the second exposure step is not limited to the one explained in the above embodiment. Other than the aforementioned combination, it is possible to use an electron beam exposure unit with an extremely high fineness and a high degree of freedom as in vector scan or raster scan in the first exposure step and to use a scanner exposure unit in the second exposure step. Alternatively, it is possible to use an electron beam exposure unit in the first exposure step and to use a stepper exposure unit in the second exposure step.

In addition, while the above description has been made for the use of different exposure units to perform the first exposure step and the second exposure step, the same exposure unit can be used to perform the first exposure step and the second exposure step with different degrees of freedom. For example, the technique of the present invention is applicable to a case where an electron beam exposure unit is used to perform exposure in a vector scan direct writing method with a point beam capable of exposure of a high fineness pattern with a high degree of freedom in the first exposure step and to perform exposure in a so-called partial collective direct writing method or a variable shaped opening method with a higher throughput but a lower degree of freedom than the vector scan method in the second exposure step.

Furthermore, while the above description has been made for a case where the offset between the first pattern and the second pattern is measured in a prior prototyping performed typically before the start of manufacturing steps of production lots and the measurement results are reflected in the production lots after the lot of the prior prototyping, similar operations may be repeated for each of two consecutive production lots. Specifically, information on an offset between the first pattern and the second pattern measured in the preceding production lot is relied on to readjust (further correct) the shape or position of a pattern to be exposed in a first exposure step the next time.

What is claimed is:

1. A method of manufacturing a semiconductor device, comprising the steps of:

a first patterning step including a step of exposing a first pattern on a semiconductor substrate in a shape adjusted with a first degree of freedom; and a second patterning step including a step of exposing a second pattern, while said second pattern is aligned with said first pattern, in a shape adjusted with a second degree of freedom equal to or lower than said first degree of freedom in said first patterning step with an exposure method different from that in said first exposure step, further comprising the steps of:

a measuring step for detecting a difference in the shape and/or position between said first pattern and said second pattern; and an adjusting step, based on said detected difference, for adjusting the shape of a first pattern in a successive first patterning step performed after the first patterning step in which said difference is measured.

2. The method of manufacturing a semiconductor device according to claim 1, wherein the exposure of said first pattern is performed by a scanner exposure unit, and the exposure of said second pattern is performed by a stepper exposure unit.

3. The method of manufacturing a semiconductor device according to claim 1, wherein the exposure of said first pattern is performed by an electron beam exposure unit, and the exposure of said second pattern is performed by a scanner exposure unit.

4. The method of manufacturing a semiconductor device according to claim 1, wherein the exposure of said first pattern is performed by an electron beam exposure unit, and the exposure of said second pattern is performed by a stepper exposure unit.

5. The method of manufacturing a semiconductor device according to claim 1, wherein the measurement of a difference in the shape and/or position between said first pattern and said second pattern is performed in a lot at a prototyping stage, and the measurement results are relied on to adjust the shape of a first pattern in a first patterning step in a production lot.

* * * * *